United States Patent [19]
Yamaguchi

[11] Patent Number: 5,406,107
[45] Date of Patent: Apr. 11, 1995

[54] STATIC SEMICONDUCTOR MEMORY DEVICE HAVING CAPACITORS FOR INCREASED SOFT ERROR IMMUNITY

[75] Inventor: Takashi Yamaguchi, Tokyo, Japan
[73] Assignee: NEC Corporation, Tokyo, Japan
[21] Appl. No.: 195,034
[22] Filed: Feb. 14, 1994
[30] Foreign Application Priority Data
Feb. 12, 1993 [JP] Japan .................................. 5-047238
[51] Int. Cl.⁶ ........................ H01L 29/78; G11C 7/00
[52] U.S. Cl. .................................. 257/393; 257/904; 365/156
[58] Field of Search .................. 257/903, 904, 393; 185/154, 156
[56] References Cited
U.S. PATENT DOCUMENTS
4,805,147  2/1989  Yamanaka et al. .................. 257/904
5,134,581  7/1992  Ishibashi et al. .................... 365/154
5,298,764  3/1994  Yamanaka et al. .................... 257/67

FOREIGN PATENT DOCUMENTS
60-38864  2/1985  Japan .................................. 257/903

OTHER PUBLICATIONS
K. Ueda et al., "Improvement of Soft Error Immunity in a Polysilicon PMOS Load Memory Cell", Proc. IEICE Fall Conf. '91, C-427, p. 5-141.

Primary Examiner—Robert P. Limanek
Attorney, Agent, or Firm—Sughrue, Mion, Zinn, Macpeak & Seas

[57] ABSTRACT

In a memory cell having a pair of driving transistors each formed of a bulk type N channel MOS transistor and a pair of load transistors each formed of a P channel thin film transistor, a capacitor is connected between a gate electrode and a drain of each of the thin film transistors. With this arrangement, it is to ameliorate immunity from a soft error caused by an external disturbance such as a-rays.

15 Claims, 7 Drawing Sheets

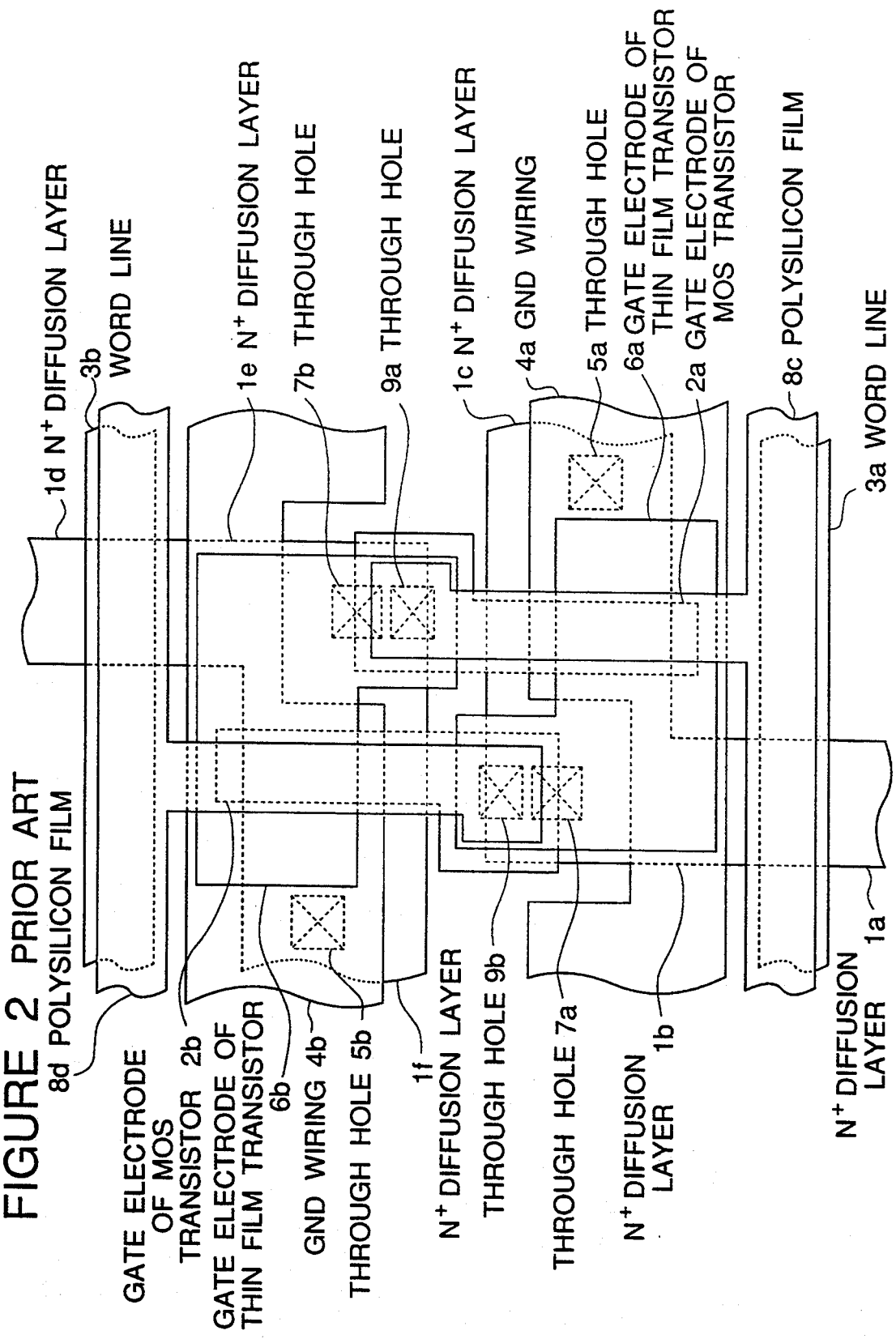

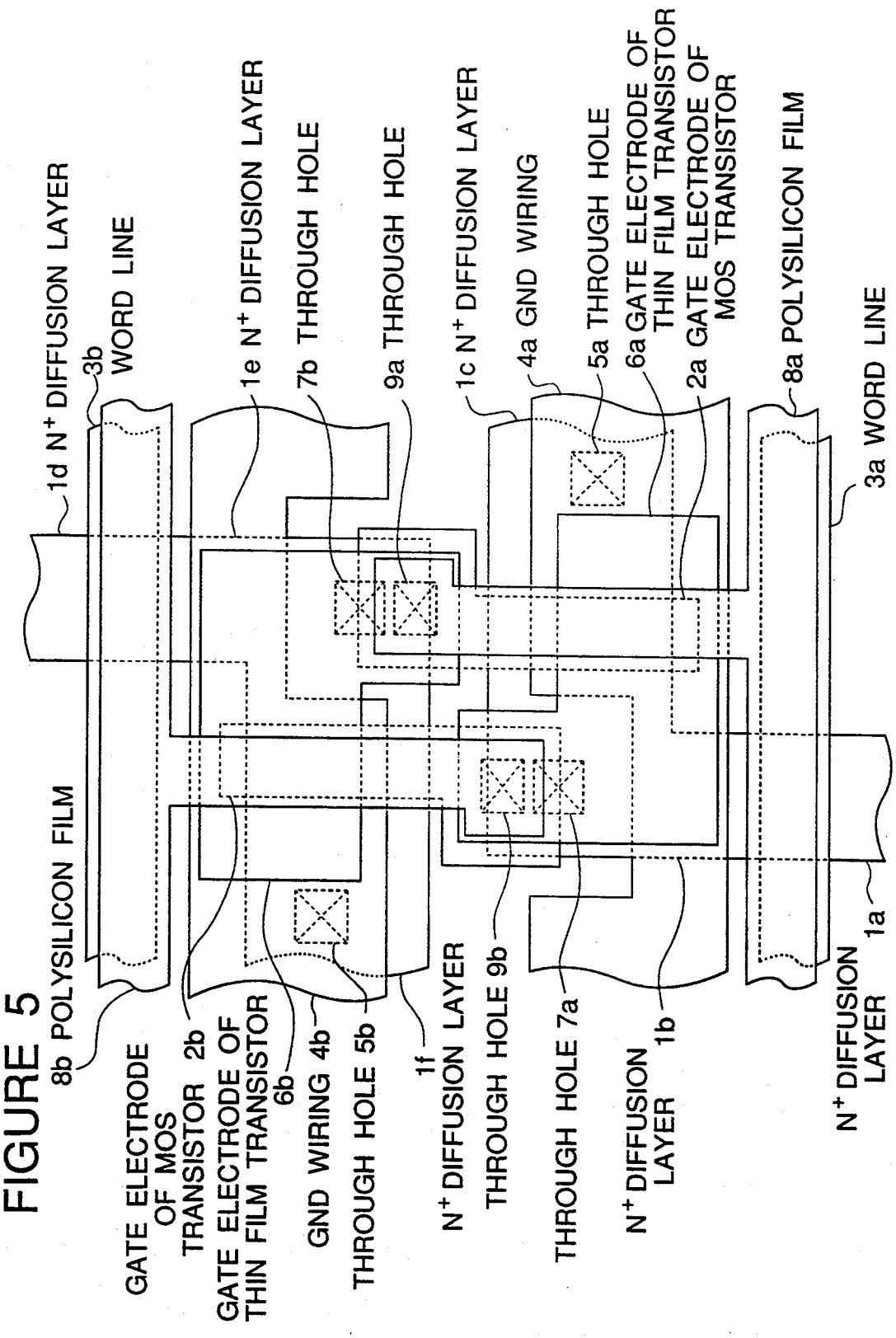

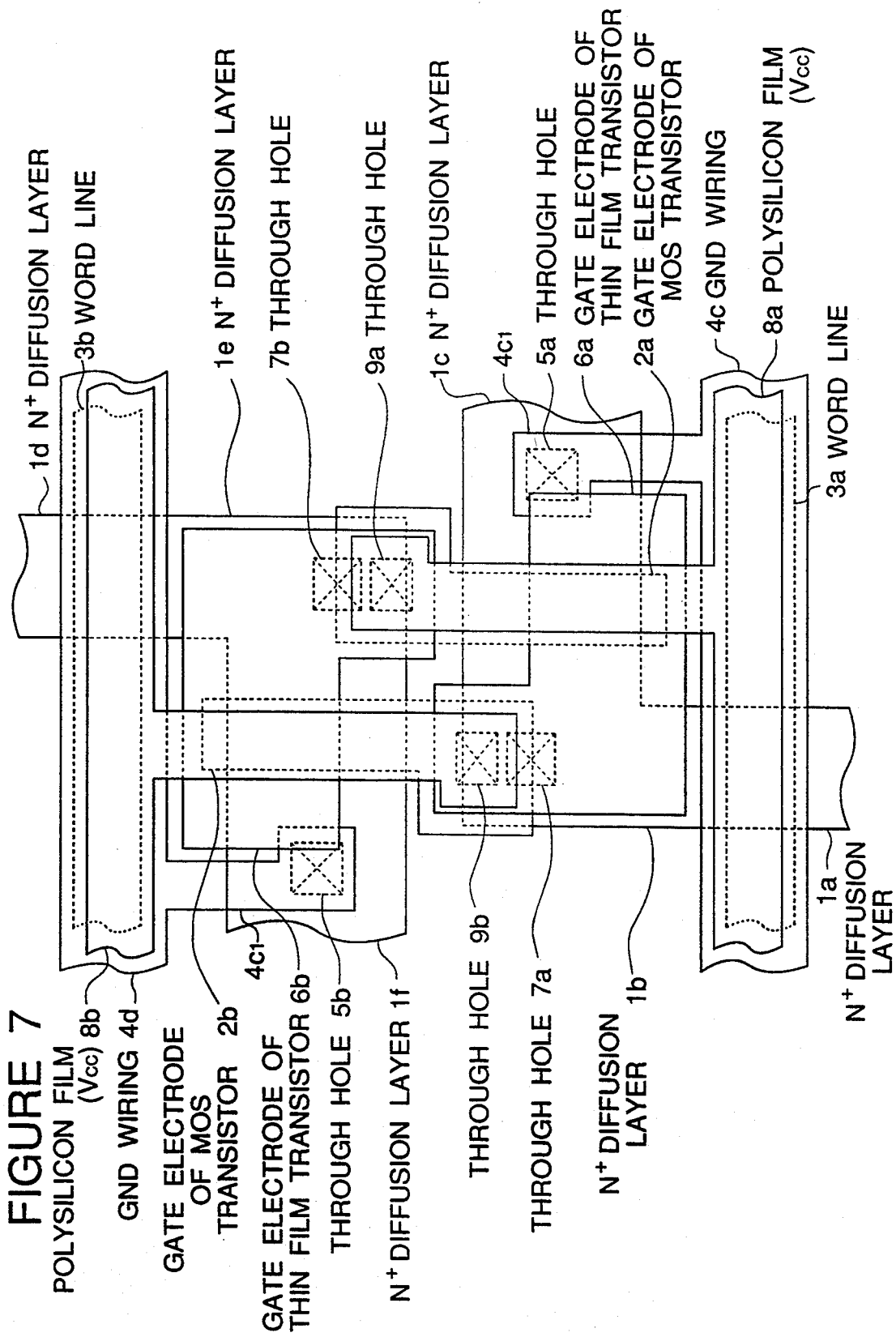

STATIC SEMICONDUCTOR MEMORY DEVICE HAVING CAPACITORS FOR INCREASED SOFT ERROR IMMUNITY

BACKGROUND OF THE INVENTION

1. Field of the Invention

The present invention relates to a static semiconductor memory device, and in particular, to a static semiconductor memory having a plurality of memory cells each of which includes a driving transistor formed of a bulk type MOS transistor and a load formed of a thin film transistor.

2. Description of Related Art

Referring to FIG. 1A, there is shown an equivalent circuit of one memory cell in a typical static semiconductor memory device in the prior art.

The memory cell shown in FIG. 1A includes a first inverter circuit composed of a P channel thin film transistor $T_1$ and an N channel MOS transistor $T_2$, and a second inverter circuit composed of a P channel thin film transistor $T_3$ and an N channel MOS transistor $T_4$. A flip flop is composed of a cross conjunction of these two inverter circuits, and the flipflop constitutes one memory cell. Data of "1" or "0" can be memorized in memory nodes $N_1$ and $N_2$ of this memory cell.

N channel MOS transistor $T_5$ and $T_6$ are provided as a transmission gate used to write data to the memory cell and to read data from the memory cell. A gate electrode of each of these MOS transistors is connected to a word line $W_L$, and one of source/drain regions of each of these MOS transistors is connected to a corresponding bit line $B_L$, and the other source/drain region is connected to the corresponding memory node $N_1$ or $N_2$ of the memory cell.

With a recent improved integration density, the load transistor (transistor $T_1$, $T_3$ in FIG. 1A) of each of the pair of inverters constituting each one flipflop, is composed of a P channel thin film transistor, which is in turn located above a bulk type N channel MOS transistor (transistor $T_2$, $T_4$ of FIG. 1A) which forms the driving transistor of the inverter.

Referring to FIG. 2, there is shown a diagrammatic layout pattern of the above mentioned memory cell circuit in a semiconductor integrated circuit device.

In FIG. 2, N+ type impurity regions $1a$, $1b$ and $1c$ are selectively formed at a surface region of a P-type semiconductor substrate (not shown) made of for example silicon. These N+ type impurity regions $1a$, $1b$ and $1c$ constitute respective source/drain regions of the transistors $T_6$ and $T_4$ of FIG. 1A. In addition, N+ type impurity regions $1d$, $1e$ and $1f$ are also selectively formed at the surface region of the same P-type semiconductor substrate so as to respective constitute source/drain regions of the transistors $T_5$ and $T_2$.

Respective gate electrodes $2a$ and $2b$ of the transistors $T_4$ and $T_2$ are formed of a first level polysilicon film, and word lines $3a$ and $3b$ are also formed of the first level polysilicon film. Here, the word lines $3a$ and $3b$ also functions as a gate electrode of the transistor $T_6$ and $T_5$, respectively.

Ground wirings $4a$ and $4b$ are formed of a second level polysilicon layer which is formed at a level higher than the first second level polysilicon layer. These ground wirings $4a$ and $4b$ are interconnected through through-holes $5a$ and $5b$ to the N+ diffusion layers $1c$ and $1f$, respectively. Respective gate electrodes $6a$ and $6b$ of the P channel thin film transistors (transistor $T_1$, $T_3$ in FIG. 1A) are formed of a third level polysilicon film which is formed at a level higher than the second second level polysilicon layer. The gate electrode $6a$ is connected to both of the gate electrode $2b$ and the N+ type diffusion layer $1b$ through a through-hole $7a$. The gate electrode $6b$ is connected to both of the gate electrode $2a$ and N+ type diffusion layer $1e$ through a through-hole $7b$.

Fourth level polysilicon film $8c$ and $8d$, which are formed at a level higher than the third second level polysilicon layer, constitute a channel region and source/drain regions of the P channel thin film transistor and also constitute a Vcc wiring. The polysilicon film $8c$ is connected to the gate electrode $6b$ of the thin film transistor by a through-hole $9a$, and similarly, the polysilicon film $8d$ is connected to the gate electrode $6a$ of the thin film transistor by a through-hole $9b$.

Being not drawn, a through-hole for connecting with a bit line (not shown) is formed on each of the N+ type diffusion layers $1a$ and $1d$.

Now, the P channel thin film transistor of the prior art will be explained in detail with reference to FIGS. 3A and 3B. FIG. 3A shows a thin film transistor part extracted from FIG. 2, and FIG. 3B is a cross-sectional view taken along the line A—A in FIG. 2.

A polysilicon film 80 formed of the fourth level polysilicon film is located above the gate electrode 60 formed of the third level polysilicon film through an insulation layer 100 interposed therebetween. The polysilicon film 80 is divided into a source region $80a$ which also functions as the Vcc wiring, a drain region $80b$ and a channel region $80c$. The source region $80a$ is a P type high impurity density region, and the drain region $80b$ is composed of a P type high impurity region $80b_1$ and a P type low impurity density region $80b_2$. These regions are formed by an ion implantation of boron.

As shown in FIG. 3, the high impurity density region $80b_1$ of the drain region is formed apart from the gate electrode 60. This is principally for the purpose of lowering a leak current in an off condition.

In the prior art static semiconductor memory device constructed as mentioned above, with advance in microminiaturization of the device size, it has become susceptible to a soft error in which data is inverted by $\alpha$-ray radiated from a package and a wiring material.

The soft error will occur in the following manner: In FIG. 1A, it is now assumed that the memory node $N_1$ is at a high level ("1") and the memory node $N_2$ is at a low level ("0") (in this case, the N+ type diffusion layer $1e$ is at a high level and the N+ type diffusion layer $1b$ is at a low level). In this state, when $\alpha$-ray is injected into the memory, electron-hole pairs are created, and the electrons created are collected into the N+ diffusion layer $1e$. Consequently, the electric potential of the memory node $N_1$ drops, so that the N channel MOS transistor $T_4$ turns OFF and the P channel thin film transistor $T_3$ turns ON. Therefore, the electric potential of the memory node $N_2$ rises up. As the result, the N channel MOS transistor $T_2$ turns ON, and the P channel thin film transistor $T_1$ turns OFF. Accordingly, the memory is put into a new and different stable state.

As a method for improving the soft error immunity in this type static semiconductor memory device, it has been proposed to lower the impurity density of the gate electrodes $6a$ and $6b$ of the thin film transistors so as to make higher its sheet resistance (Proc. IEICE fall conf.

'91, C-427, P5-141, "Improvement Of Soft Error Immunity in a Polysilicon PMOS Load Memory Cell"). In this case, to make higher the sheet resistance of the gate electrodes 6a and 6b which were ordinarily injected with phosphorus of the amount of $1 \times 10^{19}$ to $1 \times 10^{20}$ atoms/cm$^3$ in the prior art, it is necessary to lower the amount of injection of phosphorus to $1 \times 10^{17}$ to $1 \times 10^{19}$ atoms/cm$^3$.

This equivalently results in that a resistor $R_1$ is connected between respective gates of the transistor $T_1$ and $T_2$, and another resistor $R_2$ is connected between respective gates of the transistor $T_3$ and $T_4$, as shown in FIG. 1B. In FIG. 1B, element corresponding to those shown in FIG. 1A are given the same Reference Numerals, and explanation thereof will be omitted.

In the semiconductor memory device applied with the above mentioned counterplan as shown in FIG. 1B, the resistance between the memory node $N_1$ and the gate of the thin film transistor $T_3$ and the resistance between the memory node $N_2$ and the gate of the thin film transistor $T_1$ are increased, with the result that the circuit time constant for charging the gate electrode of each thin film transistor increases. Therefore, even if the electric potential of the memory node $N_1$ which was at a high level would be lowered by the injection of electrons generated by the $\alpha$-ray, the drop of the electric potential of the gate electrode of the thin film transistor $T_3$ is delayed. Accordingly, even if the $\alpha$-ray is irradiated, the transistor $T_3$ does not immediately turn ON, and therefore, the memory node $N_1$ keeps a low electric potential for some time. As a result, the thin film transistor $T_1$ continues to keep its ON state and the MOS transistor $T_2$ continues to keep its OFF state, and in a short time, the electric potential of the memory node $N_1$ recovers the high level. Accordingly, the soft error immunity is ameliorated in the improved semiconductor memory device mentioned above.

In the prior art static semiconductor memory device applied with the $\alpha$-ray immunity mentioned above, the injection amount of phosphorus into the gate electrode of the thin film resistor is reduced to a degree of $1 \times 10^{17}$ to $1 \times 10^{19}$ atoms/cm$^3$. In this case, however, a great dispersion of the sheet resistance occurs dependently upon inevitable variations in the manufacturing condition. In addition, it may happen sometimes that a sufficiently large resistance cannot be gained. In such a case, a good soft error immunity cannot be gained.

Furthermore, a sufficient effect of soft error immunity cannot be obtained by the prior art counterplan. Even though a great sheet resistance could be obtained, the $\alpha$-ray immunity would become insufficient in the case that the microminiaturization of semiconductor memory devices is further advanced.

SUMMARY OF THE INVENTION

Accordingly, it is an object of the present invention to provide a new static semiconductor memory device which has overcome the above mentioned defect of the conventional one.

Another object of the present invention is to provide a high reliable static semiconductor memory device has a greater immunity from a soft error caused by an external disturbance such as $\alpha$-ray, with no dispersion in characteristics caused dependently upon the manufacturing conditions.

The above and other objects of the present invention are achieved in accordance with the present invention by a static semiconductor memory device including a plurality of memory cells each composed of a first inverter and a second inverter which are cross-connected with each other, said first inverter being composed of a driving transistor formed of a first bulk type N channel MOS transistor and a load transistor formed of a first P channel thin film transistor, and said second inverter being composed of a driving transistor formed of a second bulk type N channel MOS transistor and a load transistor formed of a second P channel thin film transistor, wherein the improvement including a capacitor connected between a gate electrode and a drain of each of the first and second thin film transistors.

The capacitor may be formed between a gate electrode of of each of the first and second P channel thin film transistors and an extension part which constitutes a drain region of the same P channel thin film transistor and which extends over a channel region of the same P channel thin film transistor. Alternatively, the capacitor may be formed between the gate electrode of the first (or second) P channel thin transistor and a gate electrode of the second (or first) bulk type N channel MOS transistor with an insulation film being interposed therebetween.

Furthermore, a resistor may be connected between the gate electrode of the first (or second) P channel thin film transistor and the gate electrode of the first (or second) bulk type N channel MOS transistor. This resistor can be formed by making the gate electrode of the thin film transistor by a thin film of a low impurity density semiconductor or a non-doped semiconductor.

The above and other objects, features and advantages of the present invention will be apparent from the following description of preferred embodiments of the invention with reference to the accompanying drawings.

BRIEF DESCRIPTION OF THE DRAWINGS

FIG. 2 is a diagrammatic layout pattern of the prior art example shown in FIG. 1A;

FIG. 5 is a diagrammatic layout pattern of a semiconductor device of the static semiconductor memory cell shown in FIG. 4;

FIG. 7 is a diagrammatic layout pattern of a second embodiment of the static semiconductor memory cell in accordance with the present invention.

DESCRIPTION OF THE PREFERRED EMBODIMENTS

Now, embodiments of the present invention will be described with reference to the accompanying drawings.

Figure 1A:
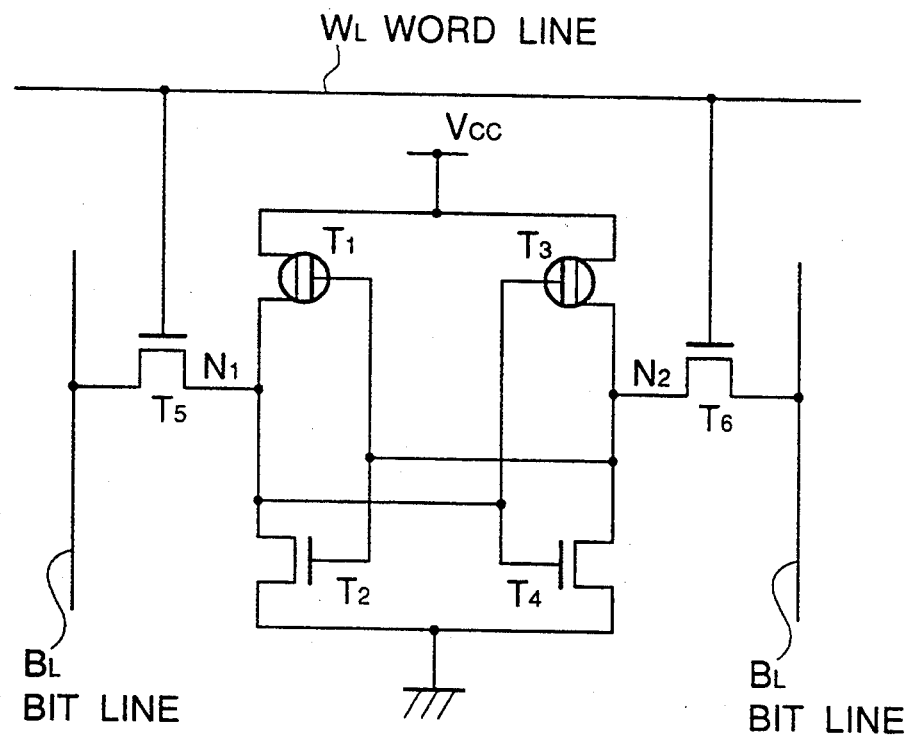
FIG. 1A is an equivalent circuit diagram of one example of the prior art static semiconductor memory cell.
Figure 1B:
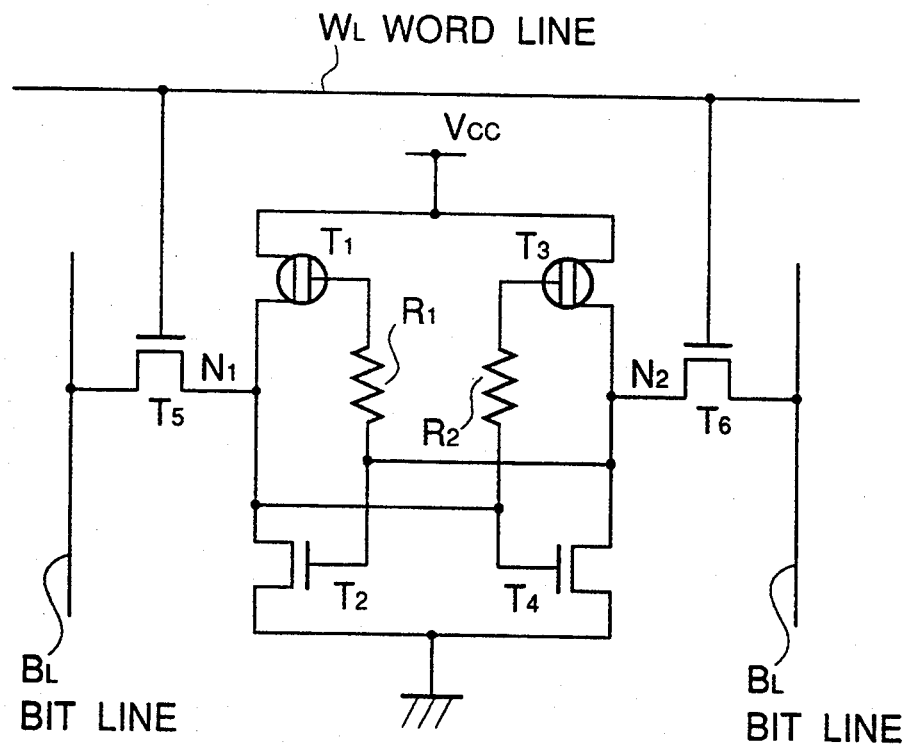
FIG. 1B is an equivalent circuit diagram of of another example of the prior art static semiconductor memory cell.
Figure 3A:
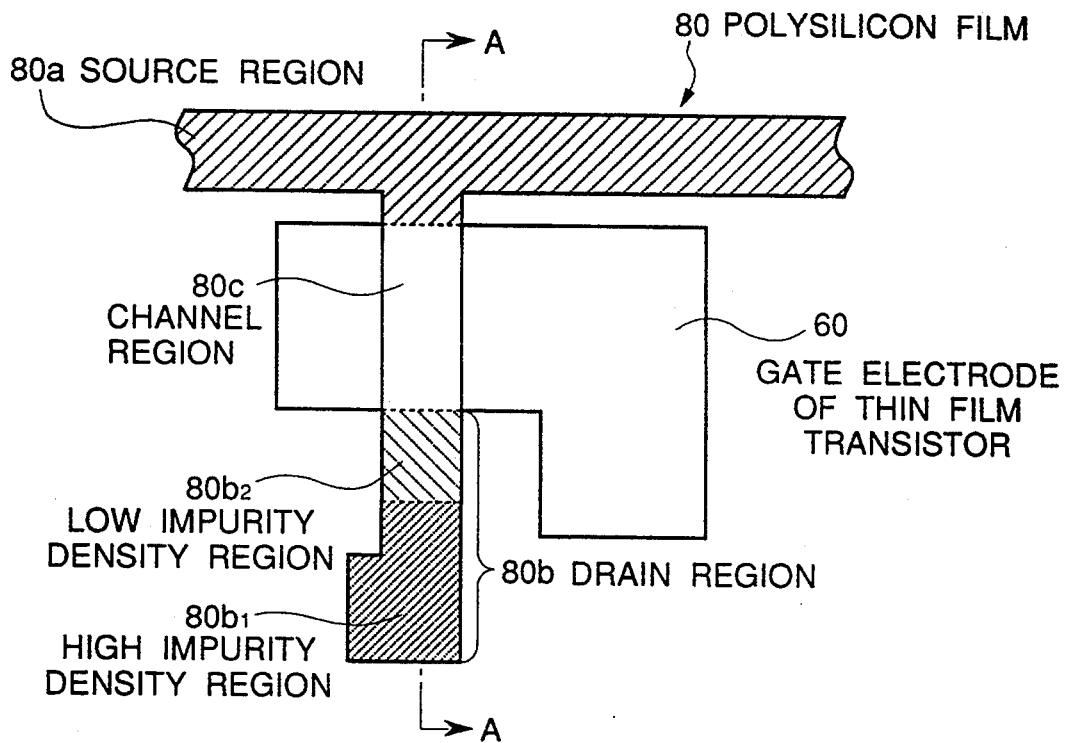
FIG. 3A is diagrammatic layout pattern of an essential part of the prior art example shown in FIG. 2.
Figure 3B:
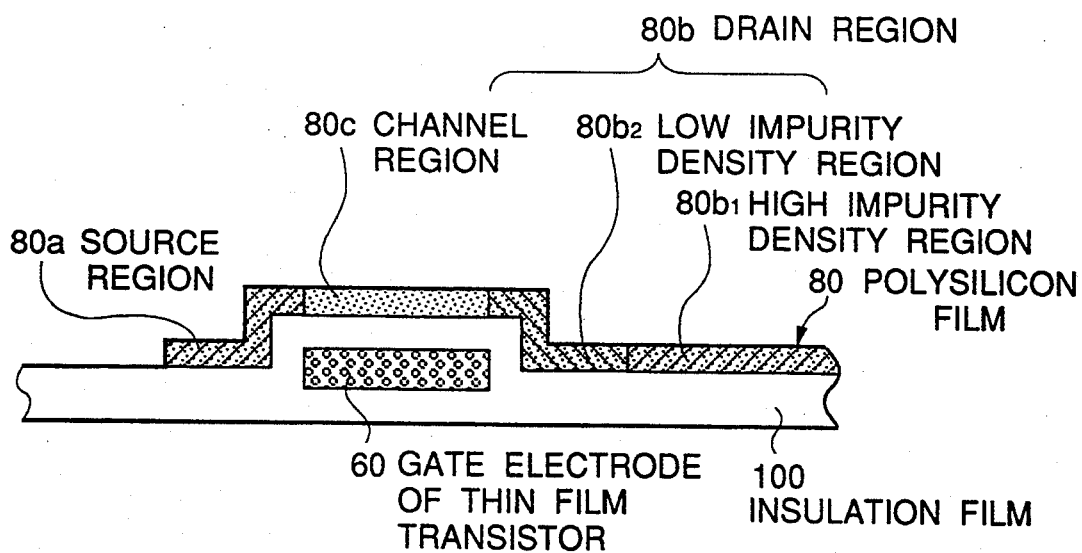
FIG. 3B is a diagrammatic sectional view taken along the line A—A in FIG. 3A.
Figure 4:
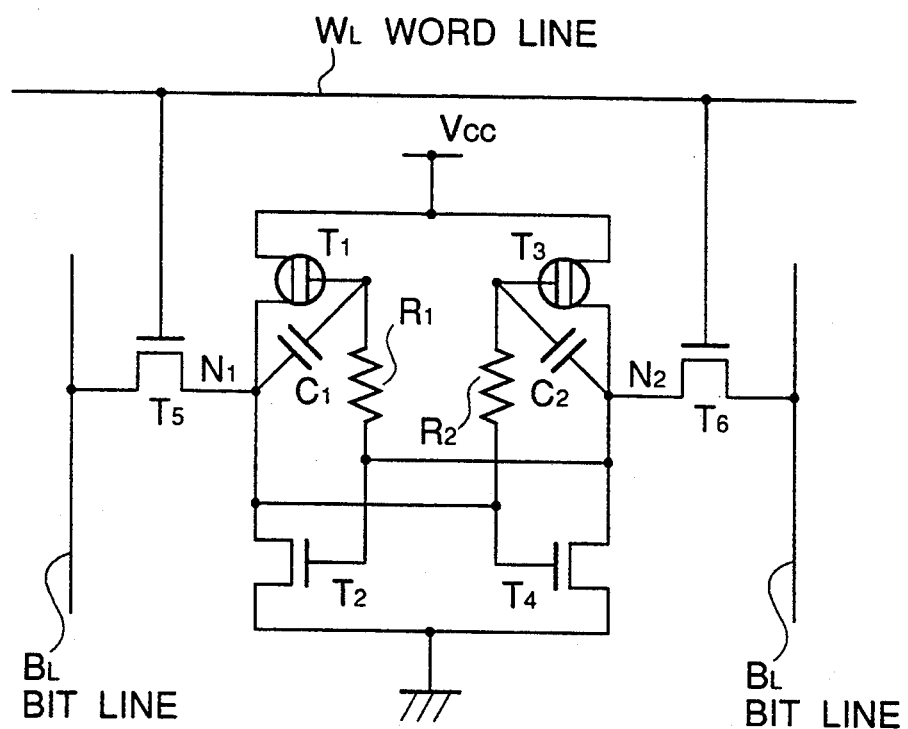
FIG. 4 is an equivalent circuit diagram of a first embodiment of the static semiconductor memory cell in accordance with the present invention.

Referring to FIG. 4, there is shown an equivalent circuit diagram of one memory cell of a number of memory cells included in the first embodiment of the static semiconductor memory device in accordance with the present invention. In FIG. 4, elements similar or corresponding to those shown in FIG. 1B are given the same Reference Symbols. Therefore. Reference Symbols $T_1$ and $T_3$ designate a P channel thin film transistor, and Reference Symbols $T_2$, $T_4$, $T_5$ and $T_6$ indicate a bulk type N channel MOS transistor. The transistor $T_1$ and $T_2$ are interconnected so as to constitute a first inverter in the form of a so-called CMOS inverter, as shown in FIG. 4. Namely, a source of the P channel transistor $T_1$ is connected to a positive voltage supply voltage Vcc, and a drain of the P channel transistor $T_1$ is connected to a drain of the N-channel transistor $T_2$. A source of the N-channel transistor $T_2$ is grounded, and in addition, a gate of the P-channel transistor $T_1$ is connected through a resistor $R_1$ to a gate of the N-channel transistor $T_2$. Similarly, the transistor $T_3$ and $T_4$ are also interconnected so as to constitute a second inverter of the CMOS inverter form. These two inverters are cross-connected with each other in such a manner that an output of each of the inverters is connected to an input of the other inverter. Accordingly, the output of the first inverter is a first memory node $N_1$, and the output of the second inverter is a second memory node $N_2$ complementary to the memory node $N_1$.

Each of the transistor $T_5$ and $T_6$ constitutes a transfer gate for writing data to the memory cell constructed as mentioned above and for reading data from the memory cell. A gate electrode of each of these transistors is connected to a word line $W_L$, and one of a pair of source/drain regions of each of these transistors is connected to a corresponding one of a pair of complementary bit lines $B_L$ and $\overline{B_L}$, and the other source/drain region of each of these transistors is connected to the corresponding memory node $N_1$ or $N_2$.

The above mentioned construction is almost the same as that of the prior art example shown in FIG. 1B. The point of the present invention different from the prior art example is that a capacitor $C_1$ or $C_2$ is connected between the gate electrode and the drain of each of the P channel thin film transistors $T_1$ and $T_3$.

Here, it is assumed that "1" and "0" are stored in the memory nodes $N_1$ and $N_2$, respectively. Here, for simplifying the explanation, it is also assumed that a voltage supply voltage Vcc is 2 V, and the voltages of 2 V and 0 V correspond to the data "1" and "0", respectively.

When α-ray radiated from the package or others hits the memory node $N_1$, electrons generated are gathered to the node $N_1$, and the electric potential of the node $N_1$ is lowered from 2 V to $-1$ V. Here, in the present invention, a capacitor $C_1$ is added between the drain and the gate electrode of the transistor $T_1$. Therefore, the gate potential of the transistor $T_1$ is caused to drop from 0 V to about $-3$ V by a bootstrap effect. Accordingly, the electric potential difference $V_{GS}$ between the gate and the source of the transistor $T_1$ greatly changes from $-2$ V (before α-ray hitting) to $-5$ V (after α-ray hitting).

Therefore, a current supplying ability of the transistor $T_1$ greatly increases after the α-ray hitting, and therefore, the transistor $T_1$ rapidly charges up the memory node $N_1$ so that the electric potential of the node $N_1$ rapidly recovers from $-1$ V to 2 V.

On the other hand, since the electric potential of the memory node $N_1$ rapidly recovers 2 V, the ON and OFF states of the transistors $T_3$ and $T_2$ do not flip, and therefore, the electric potential of the memory node $N_4$ remains 0 V. Thus, the soft error or breakdown of the memory cell which would otherwise be caused by the α-ray hitting, is prevented. Accordingly, the soft error immunity of the static semiconductor memory device is greatly improved.

Referring to FIG. 5, there is shown a diagrammatic layout pattern of the first embodiment of the present invention. In FIG. 5, elements similar or corresponding to those shown in FIG. 2 are given the same Reference Numerals.

In the shown embodiment, N+ type impurity regions $1a$, $1b$ and $1c$ are selectively formed at a surface region of a P type silicon substrate and are continuous to each other so as to depict an L-shaped pattern having a horizontal arm, a vertical arm and a corner coupling between the horizontal arm and the vertical arm in FIG. 5. These N+ type impurity regions $1a$, $1b$ and $1c$ constitute respective source/drain regions of the N channel MOS transistors $T_6$ and $T_4$. The source/drain region $1b$ is in common to both of the N channel MOS transistors $T_6$ and $T_4$. Similarly, N+ type impurity regions $1d$, $1e$ and $1f$ are also selectively formed at the surface region of the same P type semiconductor substrate so as depict an L-shaped pattern and to constitute respective source/drain regions of the N+ channel MOS transistors $T_5$ and $T_2$. The source/drain region $1e$ is in common to both of the N channel MOS transistors $T_5$ and $T_2$.

Respective gate electrodes $2a$ and $2b$ of the N channel MOS transistors $T_4$ and $T_2$ are formed of a first level polysilicon film to vertically cross the horizontal arm of the corresponding N+ type impurity regions $1c$ and $1f$, respectively. Word lines $3a$ and $3b$, which are also formed of the first level polysilicon film, horizontally extend at the outside of the N+ type impurity regions $1b$, $1c$, $1e$ and $1f$ and at the outside of the gate electrodes $2a$ and $2b$ so as to cross the vertical arm of the corresponding N+ type impurity regions $1a$ and $1d$, respectively. Therefore, the word lines $3a$ and $3b$ also constitute the gate electrode of the transistors $T_6$ and $T_5$, respectively.

Ground wire $4a$ and $4b$ are formed of a second level polysilicon film which is located at a level higher than the first second level polysilicon layer. These ground wire $4a$ and $4b$ are positioned between the word lines $3a$ and $3b$ and to extend substantially over the corresponding N+ type impurity regions $1b$ and $1c$ and $1e$ and $1f$, respectively. These ground wire $4a$ and $4b$ are interconnected through through-holes $5a$ and $5b$ to the N+ diffusion layer $1c$ and $1f$, respectively.

Respective gate electrodes $6a$ and $6b$ of the P channel thin film transistors (the transistors $T_1$ and $T_3$ in FIG. 4), are formed of a third level polysilicon film which is located at a level higher than the second second level polysilicon layer. Each of these gate electrodes $6a$ and $6b$ is in an L-shaped pattern having a horizontal portion extending over the corresponding gate electrode $2a$ or $2b$. A tip end of a vertical portion of the L-shaped gate electrode $6a$ is connected to both of the gate electrode $2b$ and the N+ diffusion layer $1b$ through a through-hole $7a$. Similarly, a tip end of a vertical portion of the gate electrode $6b$ is connected to both of the gate electrode $2a$ and the N+ diffusion layer $1e$ by a through-hole $7b$.

Fourth level polysilicon films $8a$ and $8b$, which are formed at a level higher than the third second level polysilicon layer, horizontally extend above and along the corresponding word lines $3a$ and $3b$, respectively, so as to constitute a Vcc wiring. Each of the fourth level polysilicon films $8a$ and $8b$ has a vertical portion extending perpendicularly from the horizontal portion to extend along and above the corresponding gate electrode $2a$ or $2b$ and to cross the corresponding gate electrode $6a$ or $6b$. Therefore, this vertical portion of the fourth level polysilicon film constitutes a channel region and a pair of source/drain regions of each P channel thin film transistor.

The polysilicon film $8a$ is connected to the gate electrode $6b$ of the thin film transistor through a through-hole $9a$, and the polysilicon film $8b$ is connected to the gate electrode $6a$ of the thin film transistor though a through-hole $9b$. Not shown, a through hole for connecting with the corresponding bit line (not shown) is formed on each of the N+ type diffusion regions $1a$ and $1d$.

The above mentioned first, second, third and fourth level polysilicon layers are isolated from one another by an interlayer insulating film that is omitted from the drawing for simplification of the drawing.

Here, since the N channel MOS transistors $T_6$ and $T_4$ are formed by the N+ type impurity regions $1a$, $1b$ and $1c$ as mentioned above, it can be considered that the thin film transistor $T_3$ is formed by the polysilicon film $8b$, and the resistor $R_1$ is formed of a portion of the gate electrode $6a$ starting from the through hole $7a$ and terminating at a point crossing the polysilicon film $8a$. Similarly, it can be considered that the thin film transistor $T_1$ is formed by the polysilicon film $8a$, and the resistor $R_2$ is formed of a portion of the gate electrode $6b$ starting from the through hole $7b$ and terminating at a point crossing the polysilicon film $8b$. For this purpose, the gate electrode of each thin film transistor can be formed of a thin film made of a low impurity density semiconductor or a non-doped semiconductor.

The diagrammatic layout pattern shown in FIG. 5 is almost the same as that of FIG. 2 in the pattern of the semiconductor layers. A difference is only that the polysilicon films $8c$ and $8d$ in the prior art example are replaced with the polysilicon films $8a$ and $8b$ of this embodiment. Both the polysilicon films $8a$, $8b$ and $8c$, $8d$ have an N type region doped with phosphorus (P) and a P-type region doped with boron (B), but the polysilicon films $8a$, $8b$ and $8c$, $8d$ are different in the pattern of the boron-doped P type region. This point will be explained more in detail with reference to FIG. 6.

Figure 6A:
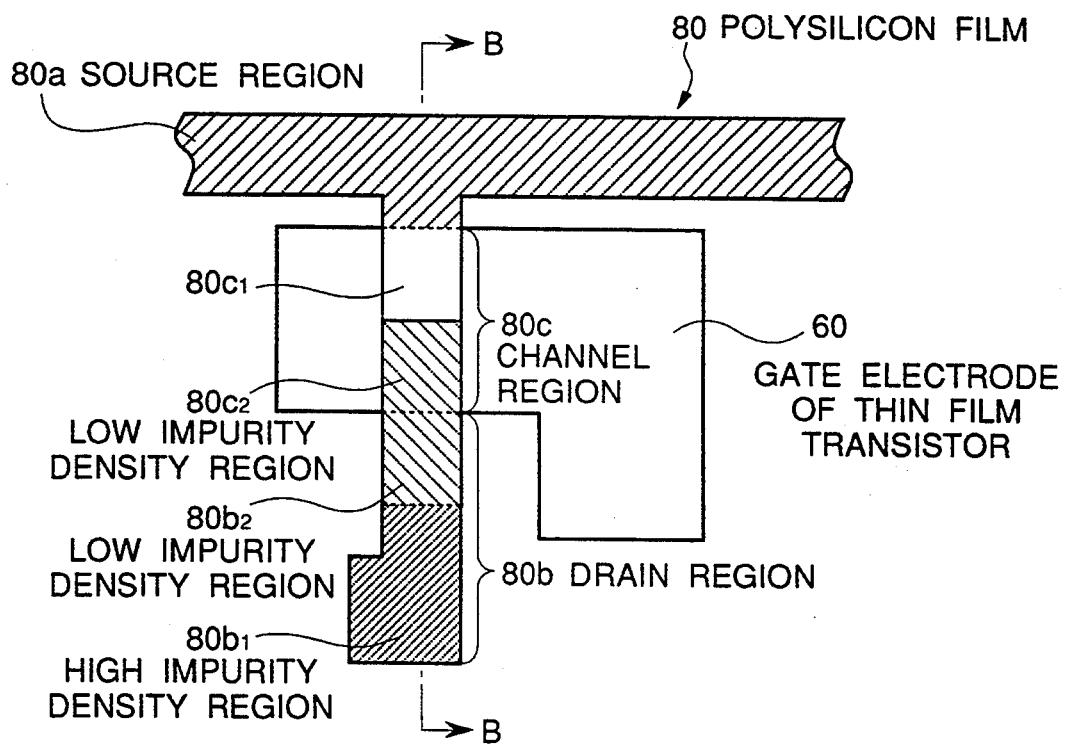
FIG. 6A is a diagrammatic layout pattern of an essential part of the semiconductor device shown in FIG. 5.
Figure 6B:
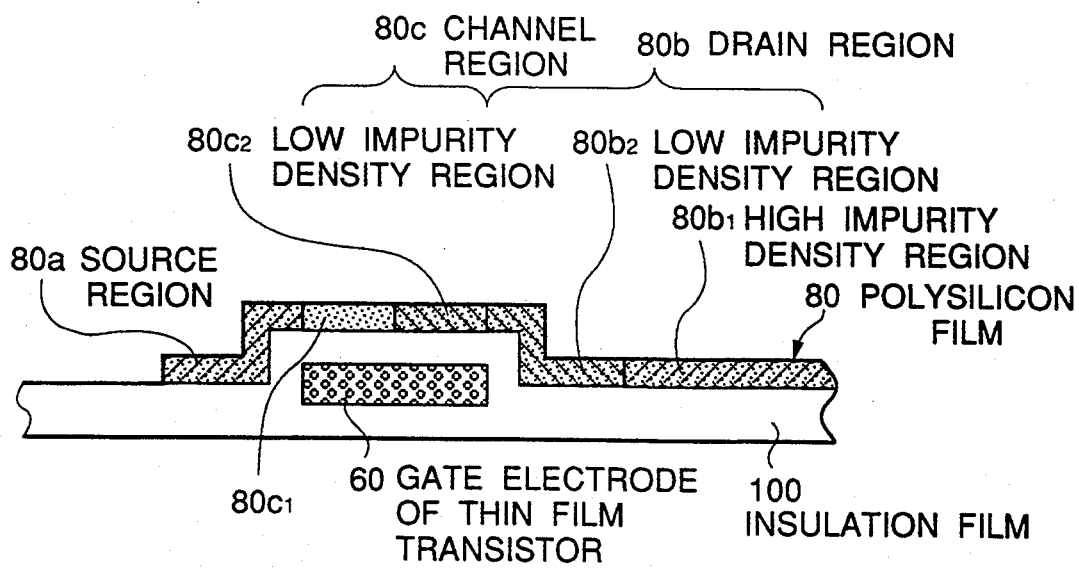
FIG. 6B is a diagrammatic sectional view taken along the line B—B in FIG. 6A.

FIG. 6A is a drawing of the thin film transistor part extracted from FIG. 5, and FIG. 6B is a diagrammatic sectional view taken along the line B—B in FIG. 6A.

A polysilicon film 80 formed of the fourth level polysilicon film is located above the gate electrode 60 formed of the third level polysilicon film with an insulation film 100 being interposed therebetween. The polysilicon film 80 is divided to a source region $80a$ which also constitutes the Vcc wiring, a drain region $80b$ and a channel region $80c$. The source region $80a$ is a P type high impurity density region, and the drain region $80b$ is composed of a P type high impurity density region $80b_1$ and a P type low impurity density region $80b_2$. Moreover, the channel region $80c$ is composed of a region remained as an N type region $80c_1$ and a P-type low impurity density region $80c_2$ doped with boron.

A capacitor is formed between the low impurity density region $80c_2$ and the gate electrode 60. This capacitor corresponds to the capacitor connected between the drain and the gate of each of the thin film transistors $T_1$ and $T_3$ as shown in FIG. 4. From another view point, the low impurity density region $80c_2$ can be deemed to be an extension of the drain region $80b$ extending over a portion of the gate electrode 60.

Further, the dose of borons injected for the high impurity density region $80b_1$ is about $1 \times 10^{15}$ to $1 \times 10^{16}/cm^2$, and the dose of borons injected for the low impurity density regions $80b_2$ and $80c_2$ are about $1 \times 10^{12}$ to $1 \times 10^{13}/cm^2$.

A more distinguishable effect of the present invention can be obtained by forming the gate electrode of the thin film transistor by a thin film of a low impurity density semiconductor or a non-doped semiconductor as mentioned above, in addition to the addition of the capacitors. Because, the above mentioned bootstrap effect may be enhanced, in addition to respective effects of the capacitors and the resistors.

Now, a second embodiment of the present invention will be explained with reference to FIG. 7.

FIG. 7 is a layout pattern of the second embodiment. In FIG. 7, elements corresponding to those in the first embodiment shown in FIG. 5 are given the same Reference Numerals, and explanation thereof will be omitted. A point of this embodiment different from the first embodiment is that the configuration of the ground wirings $4a$ and $4b$ formed of the second level polysilicon film in the first embodiment is replaced with ground wirings $4c$ and $4d$ which are modified to a form re-treated from the N+ diffusion region, in comparison with the ground wirings $4a$ and $4b$ in the first embodiment. In other words, each of the ground wirings $4c$ and $4d$ extends substantially above and along the corresponding word line $3a$ or $3b$, and has a vertical extension $4c_1$ or $4d_1$ extending perpendicularly toward the corresponding through hole $5a$ or $5b$, without overlapping with the corresponding gate electrode $2a$ or $2b$.

Namely, in the first embodiment, the ground wirings $4a$ and $4b$ formed of the second level polysilicon film are interposed between the gate electrode $2a$ and $2b$ of the MOS transistors $T_4$ and $T_2$ formed of the first level polysilicon film and the gate electrodes $6a$ and $6b$ of the thin film transistors $T_1$ and $T_3$ formed of the third level polysilicon film. In this second embodiment, however, the gate electrodes $2a$ and $2b$ of the MOS transistor $T_4$ and $T_2$ and the gate electrodes $6a$ and $6b$ of the thin film transistors $T_1$ and $T_3$ are arranged face to face with interposing no ground wiring therebetween.

With this arrangement, a capacitor is formed between the gate electrode $2a$ of the MOS transistor $T_4$ and the gate electrode $6a$ of the thin film transistor $T_1$, and a capacitor is also formed between the gate electrode $2b$ of the MOS transistor $T_2$ and the gate electrode $6b$ of the thin film transistor $T_3$. These capacitors are electrically equivalent with the capacitors which are formed between the gate electrode and the drain of the thin film transistors $T_1$ and $T_3$, respectively. Therefore, an equivalent circuit of this second embodiment is the same as that of the first embodiment shown in FIG. 4. Consequently, this second embodiment has the same effect as that obtained in the first embodiment.

The invention has thus been shown and described with reference to the specific preferred embodiments. However, it should be noted that the present invention is in no way limited to the details of these embodiments, but various changes and modifications may be made in line with the spirit of the present invention, and those changes and modification should fall under the scope of the present invention.

As mentioned above, in the static semiconductor memory device in accordance with the present invention, since the capacitor is connected between the gate electrode and the drain of each of the P-channel thin film transistors which function as a load of the memory cell, the drop of electric potential at the memory node of the memory cell caused by the irradiation of α-ray can be recovered immediately. Therefore, it is possible to greatly ameliorate the soft error immunity.

The invention has thus been shown and described with reference to the specific embodiments. However, it should be noted that the present invention is in no way limited to the details of the illustrated structures but changes and modifications may be made within the scope of the appended claims.

I claim:

1. A static semiconductor memory device including a plurality of memory cells each composed of a first inverter and a second inverter which are cross-connected with each other, said first inverter being composed of a driving transistor formed of a first bulk type N channel MOS transistor and a load transistor formed of a first P channel thin film transistor, and said second inverter being composed of a driving transistor formed of a second bulk type N channel MOS transistor and a load transistor formed of a second P channel thin film transistor, wherein the improvement comprises a capacitor connected between a gate electrode and a drain of each of the first and second thin film transistors, said capacitor having a capacitance of sufficient size such that a when a potential of a drain of a P channel thin film transistor drops due to α particles, the capacitor connected to the drain of said P channel thin film transistor causes a potential of a gate of said P channel thin film transistor to correspondingly drop so that a current is strongly injected through said P channel thin film transistor so as to quickly recover said potential of said drain of said P channel thin film transistor and thereby prevent loss of data.

2. A static semiconductor memory device claimed in claim 1 wherein a P type semiconductor thin film forming a drain region of each of the first and second thin film transistors extends over a channel region thereof, and said capacitor is formed between said extending region of said P type semiconductor thin film and the gate electrode of the corresponding thin film transistor.

3. A static semiconductor memory device claimed in claim 2 wherein an impurity density of a portion of said P type semiconductor thin film above said gate electrode and its neighborhood is less than that of the other portion of said P type semiconductor thin film.

4. A static semiconductor memory device claimed in claim 3 wherein the gate electrode of each of said first and second P channel thin film transistors is composed of a thin film of a low impurity density semiconductor or a non-doped semiconductor, and a gate of said first and second bulk type N channel MOS transistors are connected to a gate of said first and second P channel thin film transistors through a resistance component of said gate electrode of said first and second P channel thin film transistors, respectively.

5. A static semiconductor memory device claimed in claim 1 wherein said capacitor connected to said first P channel thin film transistor is formed between the gate electrode of the first P channel thin film transistor and a gate electrode of the second bulk type N channel MOS transistor with an insulation film being interposed therebetween, and said capacitor connected to said second P channel thin film transistor is formed between the gate electrode of said second P channel thin film transistor and a gate electrode of said first bulk type N channel MOS transistor with an insulation film being interposed therebetween.

6. A static semiconductor memory device claimed in claim 5 wherein the gate electrode of each of said first and second P channel thin film transistors is composed of a thin film of a low impurity density semiconductor or a non-doped semiconductor, and a gate of said first and second bulk type N channel MOS transistors are connected to a gate of said first and second P channel thin film transistors through a resistance component of said gate electrode of said first and second P channel thin film transistors, respectively.

7. A static semiconductor memory cell composed of a pair of CMOS inverter circuits cross-coupled in such a manner that an output of each of the inverter circuits is connected to an input of the other inverter circuit, each of inverter circuits being composed of a driving transistor formed of a bulk type N channel MOS transistor having its source connected to a low voltage supply voltage, its gate connected to the input of the inverter circuit, and its drain connected to the output of the inverter circuit, and a load transistor formed of a P channel thin film transistor located at a level higher than said N channel MOS transistor, said P channel thin film transistor having its drain connected to said drain of said N channel MOS transistor, it gate connected through a resistor to said gate of said N channel MOS transistor, its source connected to a high voltage supply voltage, said gate of said P channel thin film transistor being connected through a capacitor to said drain of said P channel thin film transistor itself, said capacitor having a capacitance of sufficient size such that when a potential of said drain of a P channel thin film transistor drops due to α particles, said capacitor causes a potential of said gate of said P channel thin film transistor to correspondingly drop so that a current is strongly injected through said P channel thin film transistor so as to quickly recover said potential of said drain of said P channel thin film transistor and thereby prevent loss of data.

8. A static semiconductor memory cell claimed in claim 7 wherein said P channel thin film transistor is composed of a gate electrode and a semiconductor thin film which is isolated from said gate electrode and which extends to cross said gate electrode, said semiconductor thin film including an N type channel region located to overlap said gate electrode, a P-type source region positioned at one end of said channel region, and a P-type drain region positioned at the other end of said channel region, said P-type drain region having an extension partially overlapping over said gate electrode so that said capacitor is formed between said extension of said P-type drain region and said gate electrode.

9. A static semiconductor memory cell claimed in claim 8 wherein said extension of said P-type drain region and a portion of said P-type drain region in the neighborhood of said gate electrode have an impurity density less than that of the other portion of said P-type drain region.

10. A static semiconductor memory cell claimed in claim 9 wherein the gate electrode of said P channel thin film transistor is formed of a thin film of a low impurity density semiconductor or a non-doped semiconductor, and said resistor is constituted of a resistance component of said gate electrode of said P channel thin film transistor.

11. A static semiconductor memory device claimed in claim 7 wherein said capacitor is formed between a gate electrode of said P channel thin film transistor of one of said pair of inverter circuits and a gate electrode of said bulk type N channel MOS transistor of the other of said pair of inverter circuits, with an insulation film being interposed therebetween.

12. A static semiconductor memory cell claimed in claim 11 wherein the gate electrode of said P channel thin film transistor is formed of a thin film of a low impurity density semiconductor or a non-doped semiconductor, and said resistor is constituted of a resistance component of said gate electrode of said P channel thin film transistor.

13. A static semiconductor memory cell composed of a pair of CMOS inverter circuits cross-coupled in such a manner that an output of each of the inverter circuits is connected to an input of the other inverter circuit, each of inverter circuits being composed of a driving transistor formed of a bulk type N channel MOS transistor having its source connected to a low voltage supply voltage, its gate connected to the input of the inverter circuit, and its drain connected to the output of the inverter circuit, and a load transistor formed of a P channel thin film transistor formed through an insulator film above said N channel MOS transistor, said P channel thin film transistor having its drain connected to said drain of said N channel MOS transistor, its gate connected through a resistor to said gate of said N channel MOS transistor, its source connected to a high voltage supply voltage, said P channel thin film transistor being composed of a gate electrode located on said insulator film and a semiconductor thin film which is isolated from said gate electrode and which extends to cross said gate electrode, said semiconductor thin film including an N type channel region located to overlap said gate electrode, a P-type source region positioned at one end of said channel region, and a P-type drain region positioned at the other end of said channel region, said P-type drain region having an extension partially overlapping over said gate electrode so that a capacitor is formed between said extension of said P-type drain region and said gate electrode so that said gate of said P channel thin film transistor is connected through said capacitor to said drain of said P channel thin film transistor, said capacitor having a capacitance of sufficient size such that when a potential of said drain of a P channel thin film transistor drops due to e particles, said capacitor causes a potential of said gate of said P channel thin film transistor to correspondingly drop so that a current is strongly injected through said P channel thin film transistor so as to quickly recover said potential of said drain of said P channel thin film transistor and thereby prevent loss of data.

14. A static semiconductor memory cell claimed in claim 13, wherein said extension of said P-type drain region and a portion of said P-type drain region in the neighborhood of said gate electrode having an impurity density less than that of the other portion of said P-type drain region.

15. A static semiconductor memory cell claimed in claim 14, wherein the gate electrode of said P channel thin film transistor is formed of a thin film of a low impurity density semiconductor or a non-doped semiconductor, and said resistor is constituted of a resistance component of said gate electrode of said P channel thin film transistor.

* * * * *